(12) United States Patent
Krips et al.

(10) Patent No.: US 10,999,945 B2
(45) Date of Patent: May 4, 2021

(54) DISPLACEMENT AID FOR DESKTOP DEVICES

(71) Applicant: BIOTRONIK SE & CO. KG, Berlin (DE)

(72) Inventors: Oliver Krips, Berlin (DE); Peter Grund, Berlin (DE)

(73) Assignee: BIOTRONIK SE & Co. KG, Berlin (DE)

(*) Notice: Subject to any disclaimer, the term of this patent is extended or adjusted under 35 U.S.C. 154(b) by 0 days.

(21) Appl. No.: 16/363,269

(22) Filed: Mar. 25, 2019

(65) Prior Publication Data

US 2019/0297739 A1 Sep. 26, 2019

(30) Foreign Application Priority Data

Mar. 26, 2018 (DE) ...................... 10 2018 107 119.1

(51) Int. Cl.
*H05K 5/02* (2006.01)
*F16M 13/00* (2006.01)
*G06F 1/16* (2006.01)

(52) U.S. Cl.
CPC .......... *H05K 5/0234* (2013.01); *F16M 13/00* (2013.01); *G06F 1/1656* (2013.01); *H05K 5/023* (2013.01)

(58) Field of Classification Search
CPC ..... H05K 5/0234; H05K 5/023; G06F 1/1656
USPC .................................................. 248/346.01
See application file for complete search history.

(56) References Cited

U.S. PATENT DOCUMENTS

| | | | | |
|---|---|---|---|---|
| 2,311,928 | A * | 2/1943 | Buehler | B41J 29/06 280/47.33 |
| 5,649,885 | A * | 7/1997 | Liljenquist | A63B 21/068 482/57 |
| 5,921,516 | A * | 7/1999 | Ho | A47B 91/00 248/206.5 |
| 8,596,433 | B2 | 12/2013 | Tauro | |
| 8,936,257 | B2 | 1/2015 | Kinnee | |
| 9,685,984 | B1 * | 6/2017 | Majumdar | H04B 1/3877 |
| 2010/0064944 | A1 * | 3/2010 | Su | H05K 5/0234 108/50.01 |
| 2010/0149752 | A1 * | 6/2010 | Lian | G06F 1/166 361/679.59 |
| 2012/0212886 | A1 | 8/2012 | Chou et al. | |
| 2019/0297739 | A1 * | 9/2019 | Krips | F16M 13/00 |

FOREIGN PATENT DOCUMENTS

| | | |
|---|---|---|
| CN | 2276733 Y | 3/1998 |
| DE | 1809290 A | 4/1960 |
| DE | 29604810 U1 | 7/1996 |

(Continued)

*Primary Examiner* — Muhammad Ijaz
(74) *Attorney, Agent, or Firm* — Laurence A. Greenberg; Werner H. Stemer; Ralph E. Locher

(57) ABSTRACT

A device has at least one first device foot with a first element and a second element. The device can be arranged on a supporting surface in an operating position, such that a contact area of the first element contacts the supporting surface. The device can be tilted, starting from the operating position, into a transport state, in which a contact area of the second element of the at least one device foot contacts the supporting surface and spaces the first element from the supporting surface. The contact area of the second element has a lower frictional resistance than the contact area of the first element.

15 Claims, 4 Drawing Sheets

(56) References Cited

FOREIGN PATENT DOCUMENTS

| | | |
|---|---|---|
| DE | 102007046746 A1 | 4/2009 |
| WO | 2008129577 A1 | 10/2008 |
| WO | 2012162587 A1 | 11/2012 |

\* cited by examiner

DISPLACEMENT AID FOR DESKTOP DEVICES

CROSS-REFERENCE TO RELATED APPLICATION

This application claims the priority, under 35 U.S.C. § 119, of German patent application DE 10 2018 107 119.1, filed Mar. 26, 2018; the prior application is herewith incorporated by reference in its entirety.

BACKGROUND OF THE INVENTION

Field of the Invention

The disclosure relates to a device, in particular a desktop device, which is configured to be arranged on a supporting surface or a table. The device is then operated lying on the table.

The displacement and positioning of a desktop device of this kind by being fully lifted is unergonomic, particularly in the case of larger and heavier devices. If space is limited it might even be impossible, in some circumstances, to fully lift the device or to position hands appropriately.

Furthermore, with use of rollers or similar elements, the resistance to slipping or a change in position is completely lost, or additional brakes have to be provided, which have to be actuated in addition.

In this regard document US 2012/0212886 A1 describes an electrical device in which a high and a low position of a stopping foot or a sliding foot can be adjusted by means of a lifting mechanism of the device.

BRIEF SUMMARY OF THE INVENTION

On this basis, it is an objective underlying the invention to provide a device of the kind described in the introduction which can be positioned slip-free on a supporting surface and in addition can be displaced easily on the supporting surface.

With the above and other objects in view there is provided, in accordance with the invention, a device, e.g., an electrical device and/or a medical device, comprising:

at least one first device foot, said at least one first device foot having a first element and a second element;

said first element of said at least one first device foot having a contact area in contact with a supporting surface when the device is disposed on the supporting surface in an operating position thereof;

said second element of said at least one first device foot having a contact area in contact with the supporting surface when the device is tilted, starting from the operating position, into a transport state and said first element is spaced apart from the supporting surface; and said contact area of said second element having a lower frictional resistance than said contact area of said first element.

In other words, the novel device has at least one first device foot. The at least one first device foot comprises a first element and a second element, wherein the device can be arranged on the supporting surface (for example a table or a table surface) in an operating position such that a contact area of the first element contacts the supporting surface, and wherein the device can be tilted, starting from the operating position, into a transport state, in which a contact area of the second element of the at least one first device foot contacts the supporting surface and spaces the first element (or contact area thereof) from the supporting surface, and wherein the contact area of the second element has a lower frictional resistance (in particular a lower sliding friction or static friction) relative to the supporting surface than the contact area of the first element of the at least one device foot.

In the case of the present invention the device thus can be displaced and positioned in an easy manner simply by being tilted, for example at a grip or other handle, with significantly reduced expenditure of force—compared to complete lifting. Here, it is advantageous that there is no need for an additional functional element, which directly or indirectly changes the slip properties by means of actuation.

In particular, in accordance with one embodiment, the invention provides, on the at least one first foot device, a stepped region or a second element with heavily reduced friction or rolling properties, which is arranged such that, when the device is tilted, easy sliding and positioning of the device is made possible. In this way, desktop devices, which in the normal operating position are slip-resistant, can be easily displaced and positioned by one-sided lifting or tilting.

Suitable materials or material groups for the first elements (or contact area thereof) and/or the second element (or contact area thereof) can be anti-slip materials, such as thermoplastic elastomers (TPEs) or synthetic rubbers, or sliding materials, such as polycarbonate (PC), acrylonitrile butadiene styrene (ABS), PC-ABS blends or other, harder plastics or metals. In one embodiment, a combination of PC-ABS with TPE-U (urethane-based thermoplastic elastomer) is used.

In accordance with one embodiment of the device it is provided that the contact area of the first element is designed as a (in particular non-rotating) standing area.

In accordance with one embodiment of the device it is provided that the contact area of the second element is formed as a sliding area. The sliding area has a lower frictional resistance (see also above) relative to the supporting surface as compared to the standing area, and therefore the device can slide better on the sliding area than on the standing area, which is designed to be relatively slip-proof and is intended to provide the device with resistance against slipping.

In accordance with one embodiment of the device it is also provided that the second element is formed as a curved skid.

In accordance with one embodiment of the device it is also provided that the device has a housing which in particular surrounds an electrical circuit of the device, wherein the device feet (and in particular any further standing feet) are fixed to the housing, in particular to a base of the housing.

In accordance with one embodiment of the device it is also provided that the second element of the at least one first device foot forms a protrusion projecting from the housing.

In accordance with one embodiment of the device it is also provided that this protrusion is connected integrally to the housing or is an integral part of the housing.

In accordance with one embodiment of the device it is also provided that the first element of the at least one first housing foot forms a protrusion projecting from an bottom side of a base of the housing.

In accordance with one embodiment of the device it is also provided that the first element has two legs arranged at an angle to one another. The first element can thus have an L-shaped or angled profile in particular.

In accordance with one embodiment of the device it is also provided that the second element of the at least one first device foot is arranged at a distance from the first element. The first and the second element thus in other words form a device foot in the form of a double foot and are arranged here preferably adjacently to one another and thus form a functional unit or the at least one first device foot.

In accordance with one embodiment of the device it is also provided that the first element of the at least one first device foot is arranged on the bottom side of the base of the housing of the device, wherein the second element extends starting from the bottom side, beyond the base, at least in some sections on a housing portion, wherein the housing portion runs inclined towards the base and adjoins the base. Said housing portion is arranged here in particular on a rear wall of the housing of the device or forms a transition from the base to the rear wall of the housing of the device.

In accordance with one embodiment of the device it is also provided that the second element forms a protrusion projecting from the first element. In this embodiment the second element is thus integrated in the first element such that in this regard there is no double foot provided here in the sense of a spatially separate arrangement of the first and second element.

In accordance with one embodiment of the device it is also provided that the second element extends from an edge region of the first element and/or is connected integrally to the first element.

In accordance with one embodiment of the device it is also provided that the second element is designed to form a supporting point of the device on the supporting surface when the device is tilted from the operating position into the transport state, wherein the device being tilted or tiltable about said supporting point.

In accordance with one embodiment of the device it is also provided that the first element of the at least one first device foot has a through-opening, which receives a screw of the device. By means of the screw, the first device foot for example can be fixed at the housing and/or generally two (or more) components of the device can be connected to one another.

In accordance with one embodiment of the device it is also provided that the second element of the at least one first device foot is formed by a roll (rolling property of the second element) mounted rotatably on the device, wherein the contact area of the second element is formed by a circumferential outer surface of the roll, such that the contact area can roll over the supporting surface in the transport state (the frictional resistance is a rolling friction here, which is lower than the frictional resistance, in particular static friction and/or sliding friction, of the contact area of the first element relative to the supporting surface). The second element of the at least one first device foot can be a cylindrical roll, a spherical roll, or a sphere.

In accordance with one embodiment of the device it is also provided that the device or desktop device is an electrical device and/or a medical device. The medical device can be a programming device for implantable cardiac pacemakers and/or implantable cardioverter-defibrillators.

In accordance with one embodiment of the device it is also provided that the device has a second device foot, which is opposite the at least one first device foot, wherein the second device foot also has a first element and a second element, wherein the two elements of the second device foot each have a contact area, wherein the device in the operating position can be arranged on the supporting surface such that the contact areas of the first elements contact the supporting surface, and wherein the device, starting from an idle position, can be tilted into the transport state, in which the contact areas of the second elements contact the supporting surface and the first elements are distanced from the supporting surface, and wherein the contact areas of the second elements have a lower frictional resistance than the contact areas of the first elements.

The second device foot, more specifically, for its part can be formed in accordance with one of the embodiments described above in context with the first device foot.

Basically, the device can have any number of device feet.

In accordance with one embodiment of the device it is also provided that the first device foot and in particular also the second device foot are arranged on the base of the housing adjacently to a rear wall of the housing, such that the device can be tilted from the operating position into the transport state by lifting the front side of the housing, opposite the rear side, such that the contact faces of the first elements are distanced from the supporting surface and the contact areas of the second elements contact the supporting surface (and enable a corresponding displaceability of the device).

In accordance with one embodiment of the device it is also provided that the device—apart from the at least one first or the first and the second device foot—has further standing feet, which for example are arranged on the bottom side of the base of the housing. In accordance with one embodiment, the device has two standing feet, such that the device in the operating position rests on the two device feet, in particular on the first elements of the device feet, and the two standing feet, and therefore the device in the tilted transport state contacts the supporting surface via the second elements of the device feet, wherein the first elements and the standing feet are distanced from the supporting surface.

Other features which are considered as characteristic for the invention are set forth in the appended claims.

Although the invention is illustrated and described herein as embodied in a displacement aid for a desktop device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
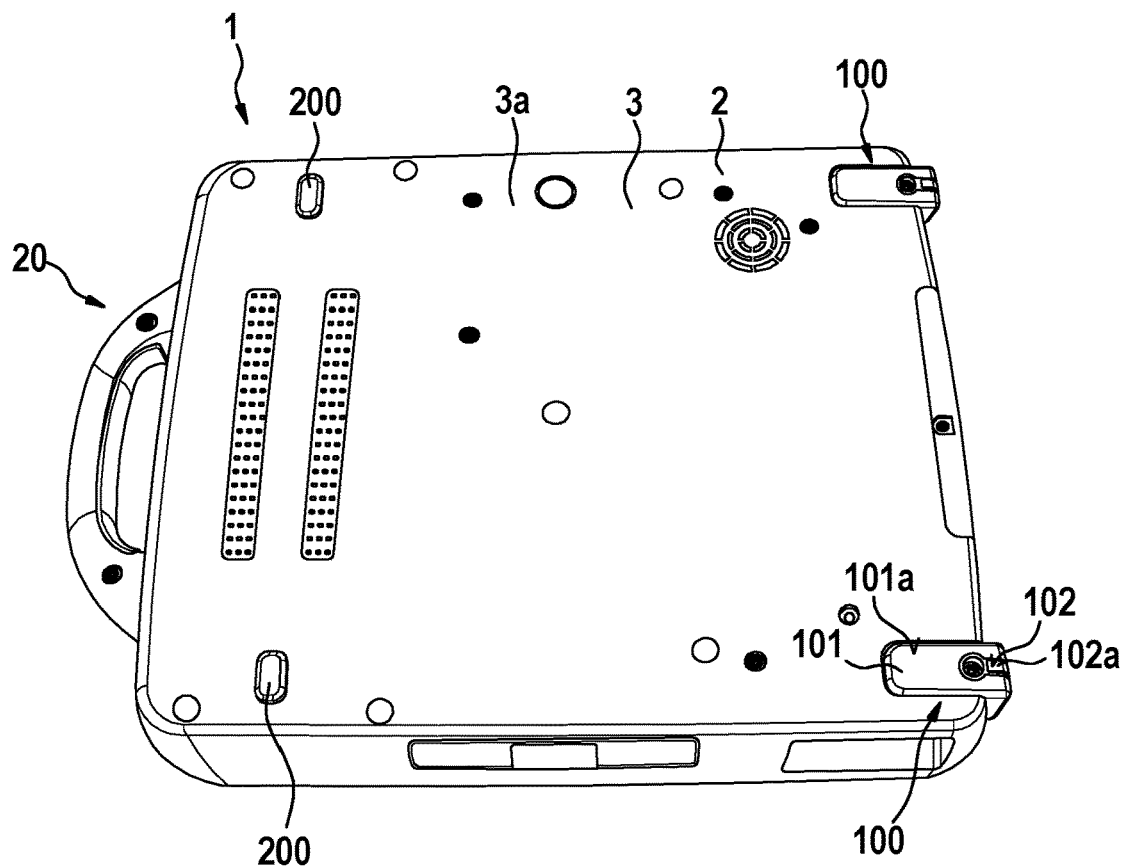
FIG. 1 shows a perspective view of the bottom side of the base of a housing of a device with two device feet, which enable the device to be easily displaced in a transport position of the device.
Figure 2:
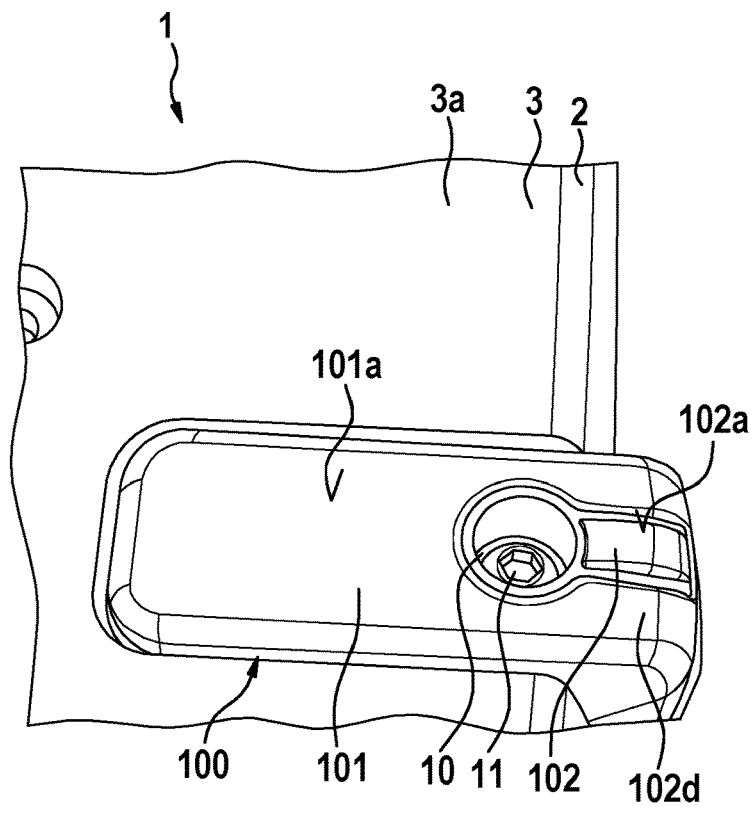
FIG. 2 shows a detail of the device shown in FIG. 1.
Figure 3:
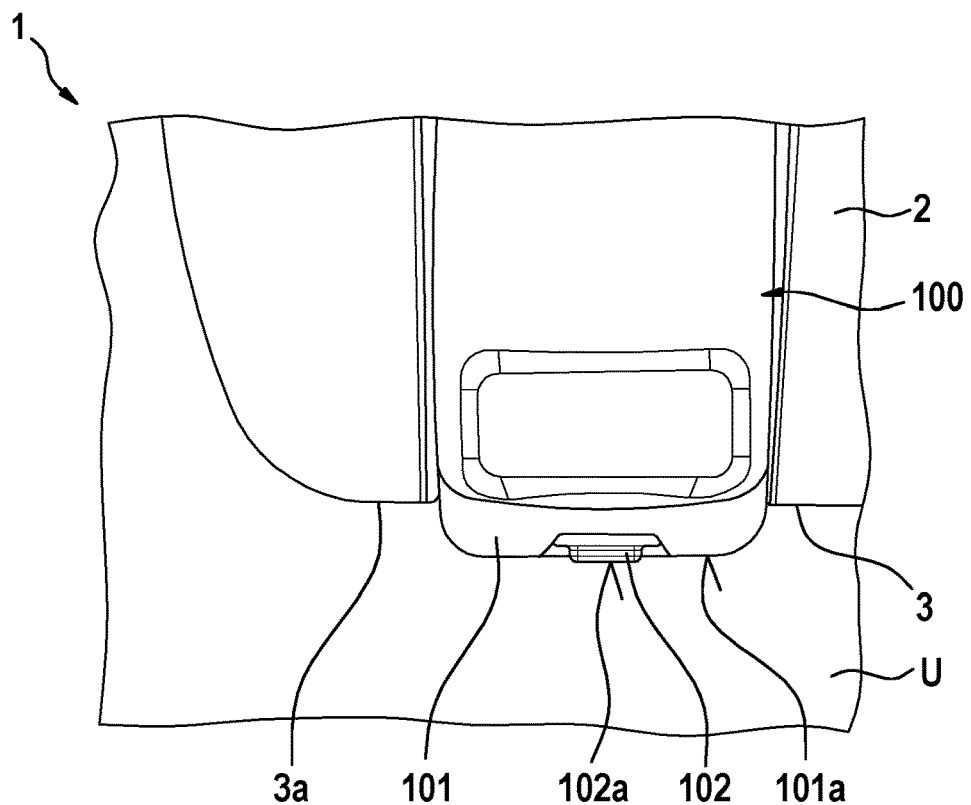
FIG. 3 shows a side view of a device foot of the device shown in FIGS. 1 and 2, wherein the device is in the operating position.
Figure 4:
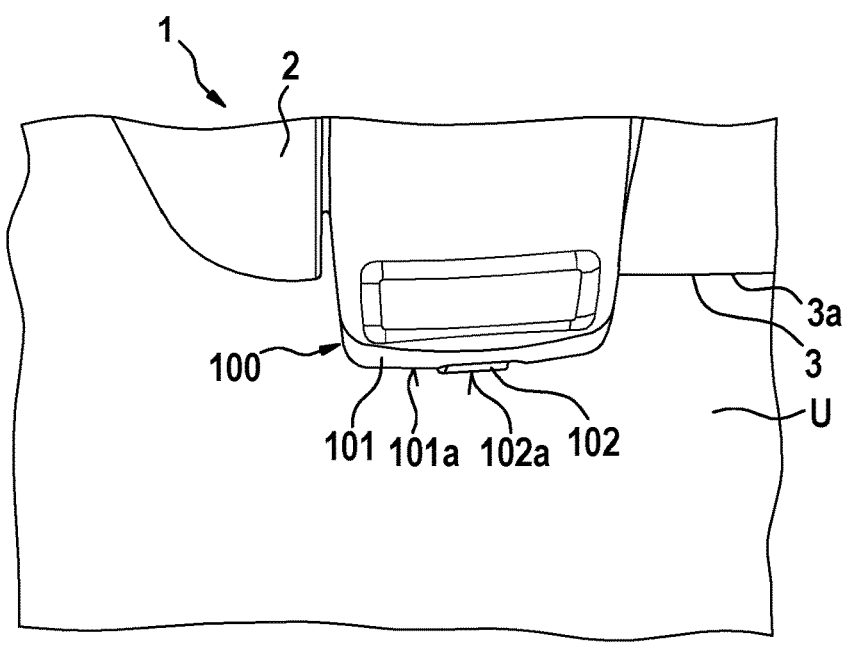
FIG. 4 shows a further side view of the device foot of FIG. 3, wherein the device is located here in the transport state or in the transport position.

Referring now to the figures of the drawing in detail and first, particularly, to FIG. 1, in combination with FIGS. 2 to 4, there is shown a first embodiment of a device 1, which in particular is a desktop device, particularly a medical desktop device 1. The device 1 according to FIG. 1 has a first and a second device foot 100, wherein each device foot 100 has a first element 101 and a second element 102. FIG. 2 shows a perspective view of the two elements 101, 102 of such device foot 100. The device 1, on account of the two device feet 100 and in particular on account of two further standing feet 200 (see FIG. 1), which are provided on the base 3 adjacently to the front side 20 of the device 1 or the housing 2, can be arranged in an operating position flat on a planar supporting surface U, which is formed here by a table, such that the contact areas 101a of each first element 101 (and the standing feet 200) contact the supporting surface U.

Proceeding from this operating position, in which the device 1 is usually operated, the device 1 can be tilted into a transport state (here for example by lifting the front side 20 of the device 1), which is shown in FIG. 4, wherein in this transport state the contact area 102a of each second element 102 contacts the supporting surface U, and the first elements 101 and the standing feet 200 are distanced from the supporting surface U. Since the contact areas 102a of the second elements 102 have a lower frictional resistance (in particular a lower sliding friction and/or static friction) relative to the supporting surface U than the contact areas 101a of the first elements 101, the device 1 in the transport state can be easily displaced, wherein the contact areas 102a of the second elements form sliding areas which reduce the friction relative to the supporting surface U.

As can be seen in particular with reference to FIG. 2, it is preferably provided that the respective second element 102 projects in the form of a protrusion from a corresponding first element 101. Here, it is provided in particular that the respective second element 102 projects from an edge region 102d of the corresponding first element 101 and at the same time is connected integrally to the associated first element 101. The higher slip resistance of the first elements 101 can be provided in that each first element 101 is formed from an anti-slip material (for example an elastomer). Alternatively, the higher slip resistance of each first element 101 can be produced by a coating of the first elements 101 with an anti-slip material (for example an elastomer).

As can also be seen in FIG. 4, the respective second element 102 in particular is designed to form a supporting point of the device 1 on the supporting surface when the device 1 is tilted from the operating position into the transport state, about which supporting point the device 1 is tilted or tiltable. In the transport state merely the second elements 102 or the contact areas 102a thereof contact the supporting surface U according to FIG. 4, whereas the first elements 101 are distanced from the supporting surface U. In the operating position, by contrast, the second elements 102 do not contact the supporting surface U (see FIG. 3).

Furthermore, the respective first element 101 according to FIG. 2 has a through-opening 10, which receives a screw 11 of the device 1. The respective through-opening 10 can be arranged adjacently to the corresponding second element 102.

For example, the respective device foot 100 can be fixed to the housing 2 by means of the corresponding screw 11. Furthermore, the respective screw 11 can also be used in principle to connect two or more components of the device 1 to one another.

Figure 5:
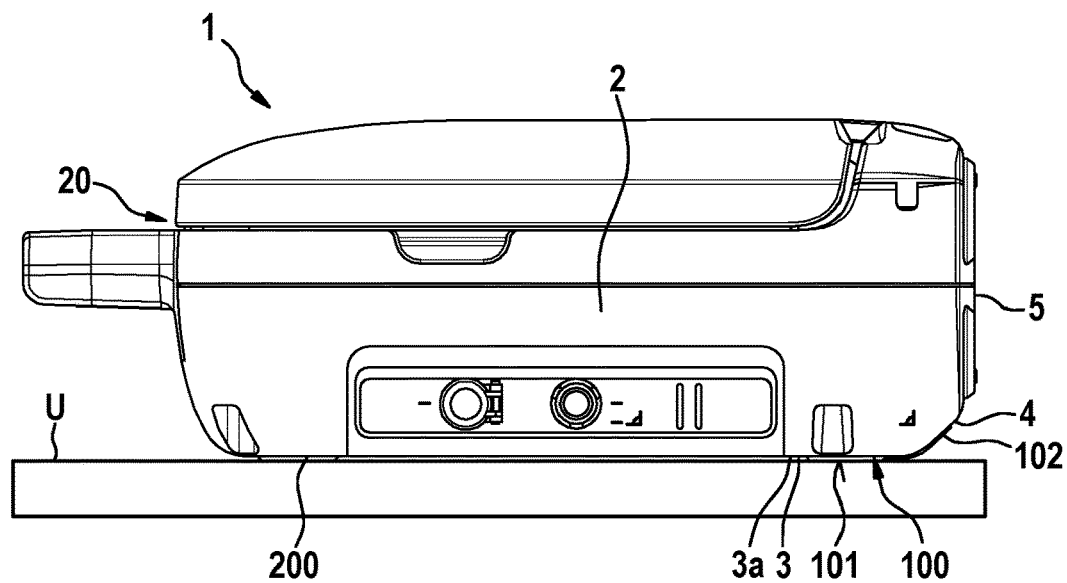
FIG. 5 shows a side view of a housing of a further device with two device feet which allow the device to be easily displaced in a transport state of the device.
Figure 6:
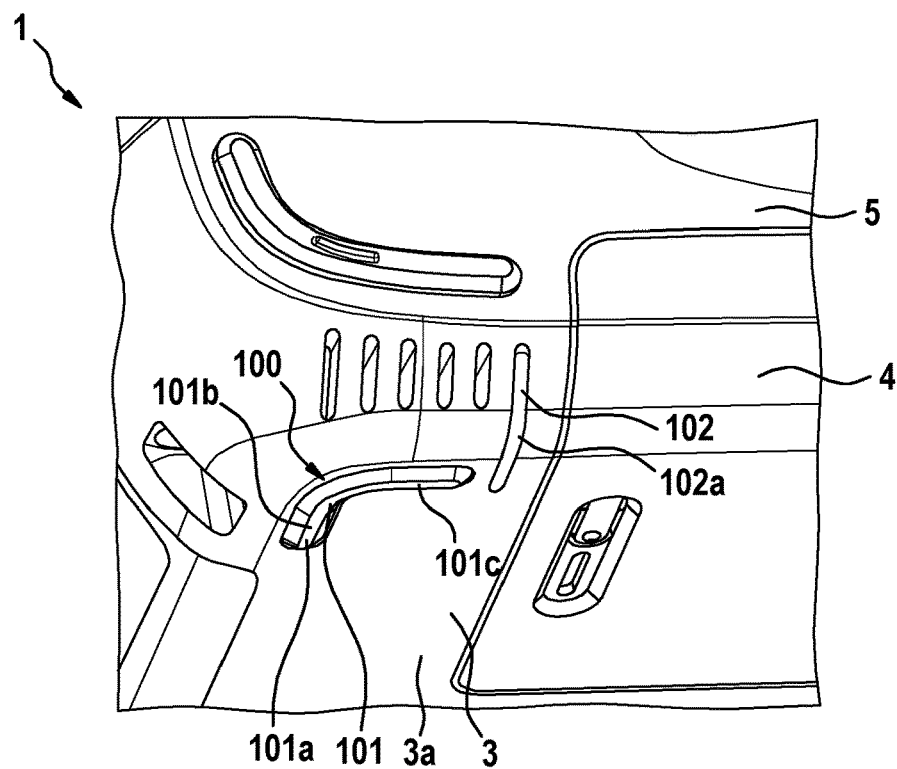
FIG. 6 shows a detail of the device shown in FIG. 5, which illustrates the design of the device feet.
Figure 7:
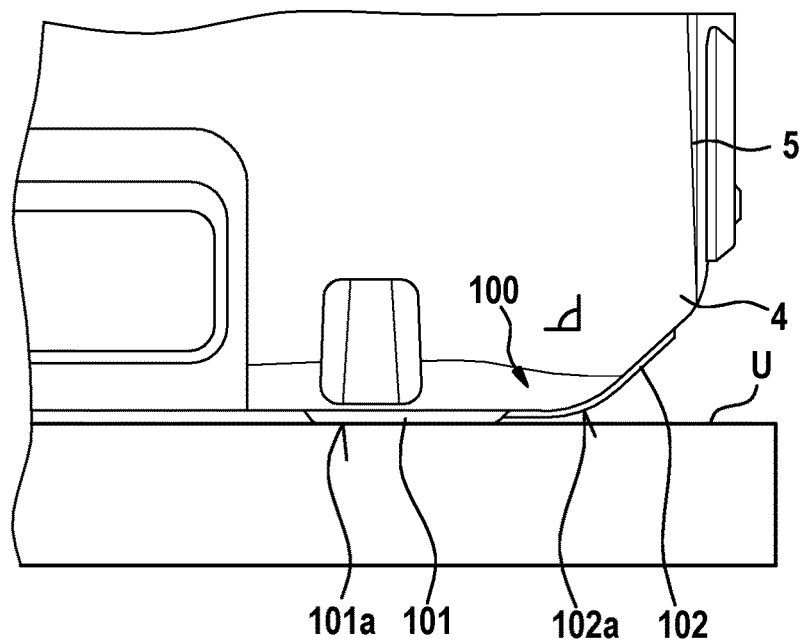
FIG. 7 shows a side view of a device foot of the device shown in FIGS. 5 and 6, wherein the device is in the operating position.
Figure 8:
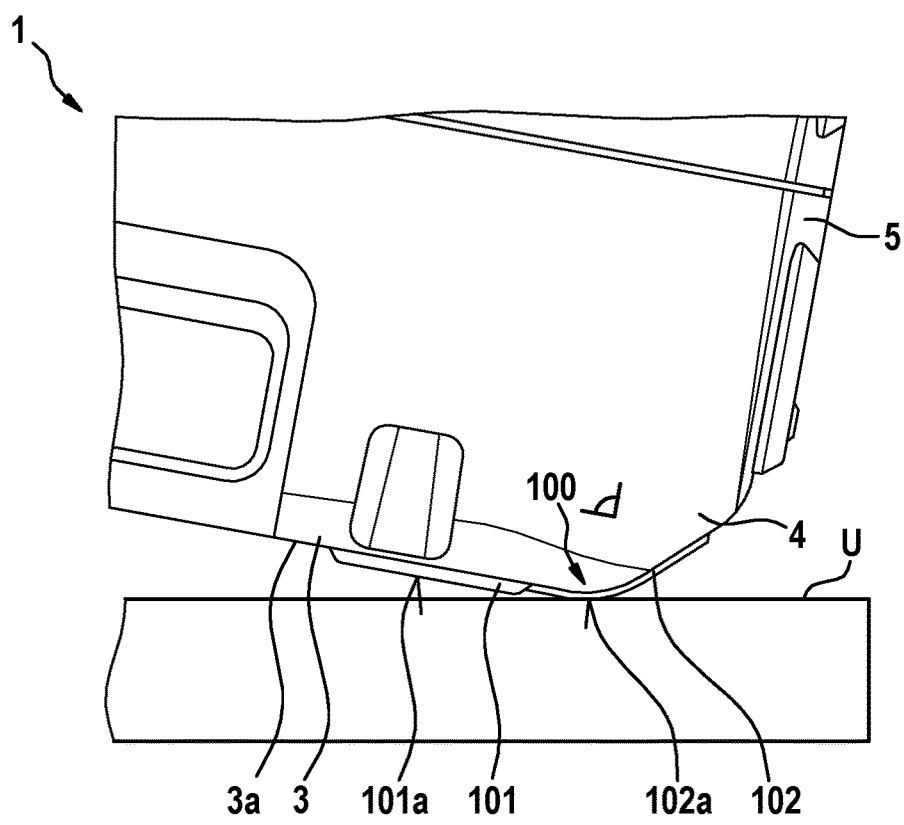
FIG. 8 shows a further side view of the device foot of FIG. 7, wherein here the device is in the transport state.

FIG. 5, in conjunction with FIGS. 6 to 8, shows an alternative embodiment of a device 1. Whereas here the respective first element 101 (see FIG. 6) has in particular two legs 101b, 101c arranged at an angle to one another, the respective second element 102 is arranged adjacently to the corresponding first element 101 and forms a skid, which is formed in one piece with the housing 2 of the device 1 and which, starting from the bottom side 3a of the base 3 of the housing 2, extends beyond the base 3 on a housing portion 4 of the housing 2, wherein the housing portion 4 runs inclined towards the base 3, as can be seen for example from FIG. 7. As a result, the respective skid 102 comes into contact with the supporting surface U when the device 1 is tilted, such that it is possible to displace the device 1 easily, since it contacts the supporting surface U in the transport state solely via said skids 102.

The features disclosed in the description, the claims and the drawings can be relevant either individually or in any combination with one another for the implementation of embodiments.

The invention claimed is:

1. A device, comprising:
   at least one first device foot, said at least one first device foot having a first element and a second element together forming a one-piece integral unit, with said second element being integrated in, and adjoining, said first element, and with said first element and said second element of said at least one device foot being non-moveable relative to one another;
   said first element of said at least one first device foot having a contact area in contact with a supporting surface when the device is disposed on the supporting surface in an operating position thereof;
   said second element of said at least one first device foot having a contact area in contact with the supporting surface when the device is tilted, starting from the operating position, into a transport state and said first element is spaced apart from the supporting surface; and
   said contact area of said second element having a lower frictional resistance than said contact area of said first element.

2. The device according to claim 1, wherein said contact area of said first element is a standing support area.

3. The device according to claim 1, wherein said contact area of said second element is a sliding support area.

4. The device according to claim 1, wherein said second element is a curved skid projecting away from said first element and being inclined relative to said first element.

5. The device according to claim 1, further comprising a housing.

6. The device according to claim 5, wherein said second element forms a protrusion projecting from said housing.

7. The device according to claim 6, wherein said protrusion is integrally formed on said housing.

8. The device according to claim 5, wherein said housing has a base and said first element is a protrusion projecting from a bottom side of said base of said housing.

9. The device according to claim 8, wherein said first element has two legs arranged at an angle to one another.

10. The device according to claim 5, wherein said housing has a base and said first element is arranged on a bottom side of said base of said housing, and wherein said second element, starting from the bottom side of said base, extends beyond said base at least in some sections on a housing portion, wherein the housing portion runs inclined towards said base and adjoins said base.

11. The device according to claim 1, wherein said second element is a protrusion projecting from said first element.

12. The device according to claim 1, wherein said second element is a roller rotatably mounted on the device, wherein said contact area of said second element is formed by a circumferential outer surface of said roller, such that said contact area rolls on the supporting surface in the transport state of the device.

13. The device according to claim 1, configured as at least one of an electrical device or a medical device.

14. The device according to claim 1, further comprising:
a second device foot disposed opposite said at least one first device foot;
said second device foot having a first element and a second element, each of said first and second elements of said second device foot having a contact area;
wherein, in the operating position of the device, said contact areas of said first elements contact the supporting surface, and wherein the device, starting from a rest position, can be tilted into the transport state, in which said contact areas of said second elements contact the supporting surface and said first elements are distanced from the supporting surface; and
said contact areas of said second elements having a lower frictional resistance than said contact areas of said first elements.

15. A device, comprising:
a housing;
at least one first device foot formed on a bottom of said housing for supporting said housing on a support surface, said at least one first device foot having a first element and a second element;
said first element of said at least one first device foot having a contact area in contact with the supporting surface when the device is disposed on the supporting surface in an operating position thereof;
said second element of said at least one first device foot having a contact area in contact with the supporting surface when the device is tilted, starting from the operating position, into a transport state and said first element is spaced apart from the supporting surface; and
said contact area of said second element having a lower frictional resistance than said contact area of said first element;
said housing having a base and said first element being arranged on a bottom side of said base of said housing, and said second element, starting from the bottom side of said base, extending beyond said base at least in some sections on a housing portion that runs inclined towards said base and adjoins said base.

* * * * *